(12) United States Patent
Caine

(10) Patent No.: US 7,578,955 B2
(45) Date of Patent: Aug. 25, 2009

(54) IN-MOLD SEPARATED LIGHT GUIDES

(75) Inventor: Michael E. Caine, Needham, MA (US)

(73) Assignee: Motorola, Inc., Schaumburg, IL (US)

( * ) Notice: Subject to any disclaimer, the term of this patent is extended or adjusted under 35 U.S.C. 154(b) by 232 days.

(21) Appl. No.: 11/830,300

(22) Filed: Jul. 30, 2007

(65) Prior Publication Data
US 2009/0034273 A1 Feb. 5, 2009

(51) Int. Cl.
*B28B 1/48* (2006.01)
(52) U.S. Cl. .................. 264/155; 264/254; 264/154
(58) Field of Classification Search ........... 264/154, 264/155, 259, 132, 275; 428/332, 412; 362/600, 362/605
See application file for complete search history.

(56) References Cited

U.S. PATENT DOCUMENTS

| | | | | |
|---|---|---|---|---|
| 3,668,034 | A * | 6/1972 | Nicholas et al. | 264/241 |
| 4,418,033 | A * | 11/1983 | Hatakeyama | 264/509 |
| 5,049,337 | A * | 9/1991 | Katagiri et al. | 264/156 |
| 5,318,739 | A * | 6/1994 | Katagiri et al. | 264/266 |
| 5,477,024 | A * | 12/1995 | Share et al. | 219/121.69 |
| 5,935,497 | A * | 8/1999 | Rose | 264/132 |
| 6,264,869 | B1* | 7/2001 | Notarpietro et al. | 264/247 |
| 6,458,913 | B1* | 10/2002 | Honigfort et al. | 528/196 |
| 6,752,946 | B2 | 6/2004 | Toyooka | |

FOREIGN PATENT DOCUMENTS

| | | | |
|---|---|---|---|
| EP | 1631857 B2 | 3/2006 | |
| JP | 2000190409 A1 | 7/2000 | |
| JP | 2003092189 | * 3/2003 | ............. 33/26 |

OTHER PUBLICATIONS

International Search Report and Written Opinion, PCT (Patent Cooperation Treaty), International Application No. PCT/US2008/070592, International Filing Date: Jul. 21, 2008, Priority Date: Jul. 30, 2007, 11 pages.

* cited by examiner

*Primary Examiner*—Ali Alavi
(74) *Attorney, Agent, or Firm*—Terry W. Forsythe; Gary J. Cunningham

(57) ABSTRACT

A molded plastic structure (100) can include an in-mold decoration (112) having at least a first illumination feature (108) positioned at a first portion (142) of the molded plastic structure. The molded plastic structure also can include a first substrate (114) positioned proximate to the in-mold decoration, and a substantially optically clear or translucent second substrate (116) positioned proximate to the in-mold decoration. The second substrate can extend from the first portion of the molded plastic structure to a second portion (144) of the molded plastic structure. The second portion can be distal from the first portion. A separation layer (320) can be positioned between at least a portion of the first substrate and at least a portion of the second substrate. The separation layer can backscatter a substantial portion of light incident on at least a first side of the separation layer.

21 Claims, 2 Drawing Sheets

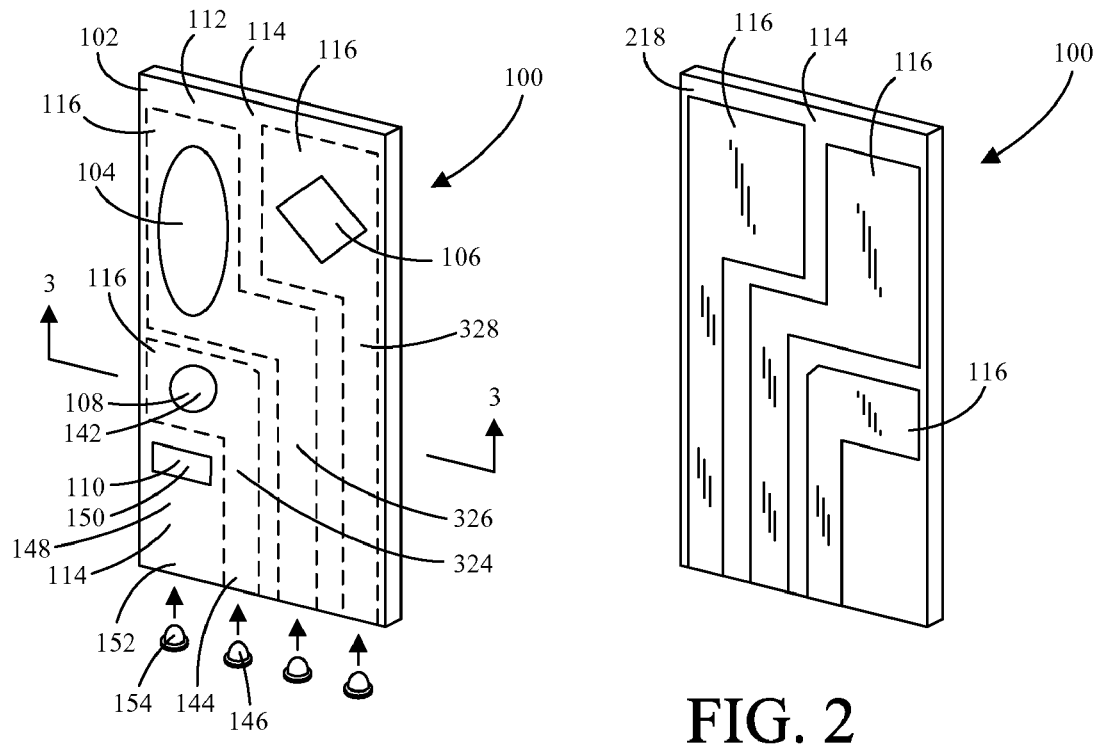
FIG. 1
FIG. 2
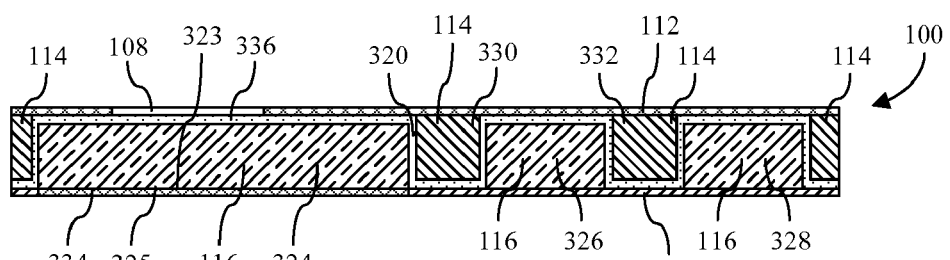
FIG. 3
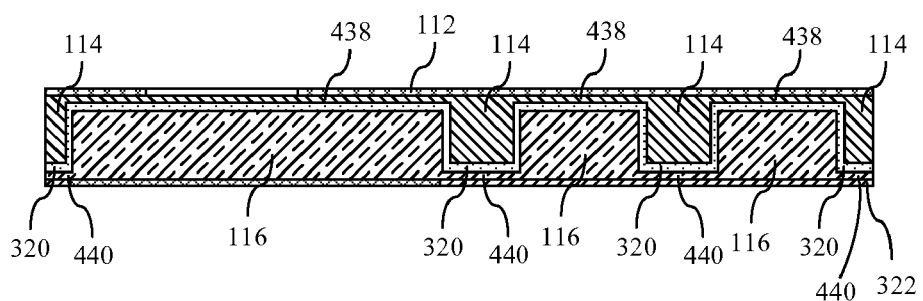
FIG. 4

IN-MOLD SEPARATED LIGHT GUIDES

BACKGROUND OF THE INVENTION

1. Field of the Invention

The present invention generally relates to plastics and, more particularly, to plastic molding processes.

2. Background of the Invention

On modern electronic devices, it is oftentimes desirable to illuminate selected portions of one or more exterior surfaces. For example, it may be desirable to illuminate graphics and icons on a keypad in order to convey information to a user based on a specific input or operating mode. It also may be desirable to display graphics or patterns on a device to indicate a ringtone alert, provide gaming feedback, or to enhance music playback. The placement and illumination of such graphics is limited by the ability to locate lighting elements in proximity to a desired graphic, and in isolating the illumination of the desired graphic from other nearby graphics.

Light pipes (e.g. fiber optic cables) can be used to convey light from a lighting element, such as a light emitting diode (LED), to a desired location elsewhere on the device. A conventional light pipe oftentimes comprises a clear or translucent material, such as glass or plastic, surrounded by a reflective material, or material of differing refractive index, that maintains light inside the clear or translucent material until the light reaches the desired location. Such light pipes typically are expensive, bulky or can be difficult to assemble into a compact package, however.

SUMMARY OF THE INVENTION

The present invention relates to a molded plastic structure. The molded plastic structure can include an in-mold decoration having at least a first illumination feature positioned at a first portion of the molded plastic structure. The molded plastic structure also can include a first substrate positioned proximate to the in-mold decoration, and a substantially optically clear or translucent second substrate positioned proximate to the in-mold decoration. The second substrate can extend from the first portion of the molded plastic structure to a second portion of the molded plastic structure. The second portion can be distal from the first portion. A separation layer can be positioned between at least a portion of the first substrate and at least a portion of the second substrate. The separation layer can backscatter a substantial portion of light incident on at least a first side of the separation layer.

The present invention also relates to a device housing, which can include an in-mold decoration having at least a first illumination feature positioned at a first portion of the device housing. A first substrate can be positioned proximate to the in-mold decoration. A substantially optically clear or translucent second substrate can be positioned proximate to the in-mold decoration. The second substrate can extend from the first portion of the device housing to a second portion of the device housing. The second portion can be distal from the first portion. A separation layer can be positioned between at least a portion of the first substrate and at least a portion of the second substrate. The separation layer can backscatter a substantial portion of light incident on at least a first side of the separation layer.

The present invention also relates to a method of manufacturing a molded plastic structure. The method can include inserting an in-mold decoration into a mold having a first cavity configuration. The in-mold decoration can include at least a first illumination feature. The method also can include injecting a first substrate into the mold, forming a separation layer over the first substrate, and injecting a second translucent or optically clear substrate into the mold to define at least one light pipe extending from a first portion of the molded plastic structure proximate to the first illumination feature to a second portion of the molded plastic structure distal from the illumination feature.

In another arrangement, the method can include inserting an in-mold decoration into a mold having a first cavity configuration. The in-mold decoration can include at least a first illumination feature. The method also can include injecting a first translucent or optically clear substrate into the mold to define at least one light pipe extending from a first portion of the molded plastic structure proximate to the first illumination feature to a second portion of the molded plastic structure distal from the illumination feature. A separation layer can be formed over the first substrate, and a second substrate can be injected into the mold.

BRIEF DESCRIPTION OF THE DRAWINGS

Preferred embodiments of the present invention will be described below in more detail, with reference to the accompanying drawings, in which:

FIG. 1 depicts a perspective view of a first side of a molded plastic structure that is useful for understanding the present invention;

FIG. 2 depicts a perspective view of a second side of the molded plastic structure of FIG. 1;

FIG. 3 is an enlarged section view of the molded plastic structure of FIG. 1, taken along section line 3-3;

FIG. 4 is another enlarged section view of the molded plastic structure of FIG. 1, taken along section line 3-3.

DETAILED DESCRIPTION

Figure 5:
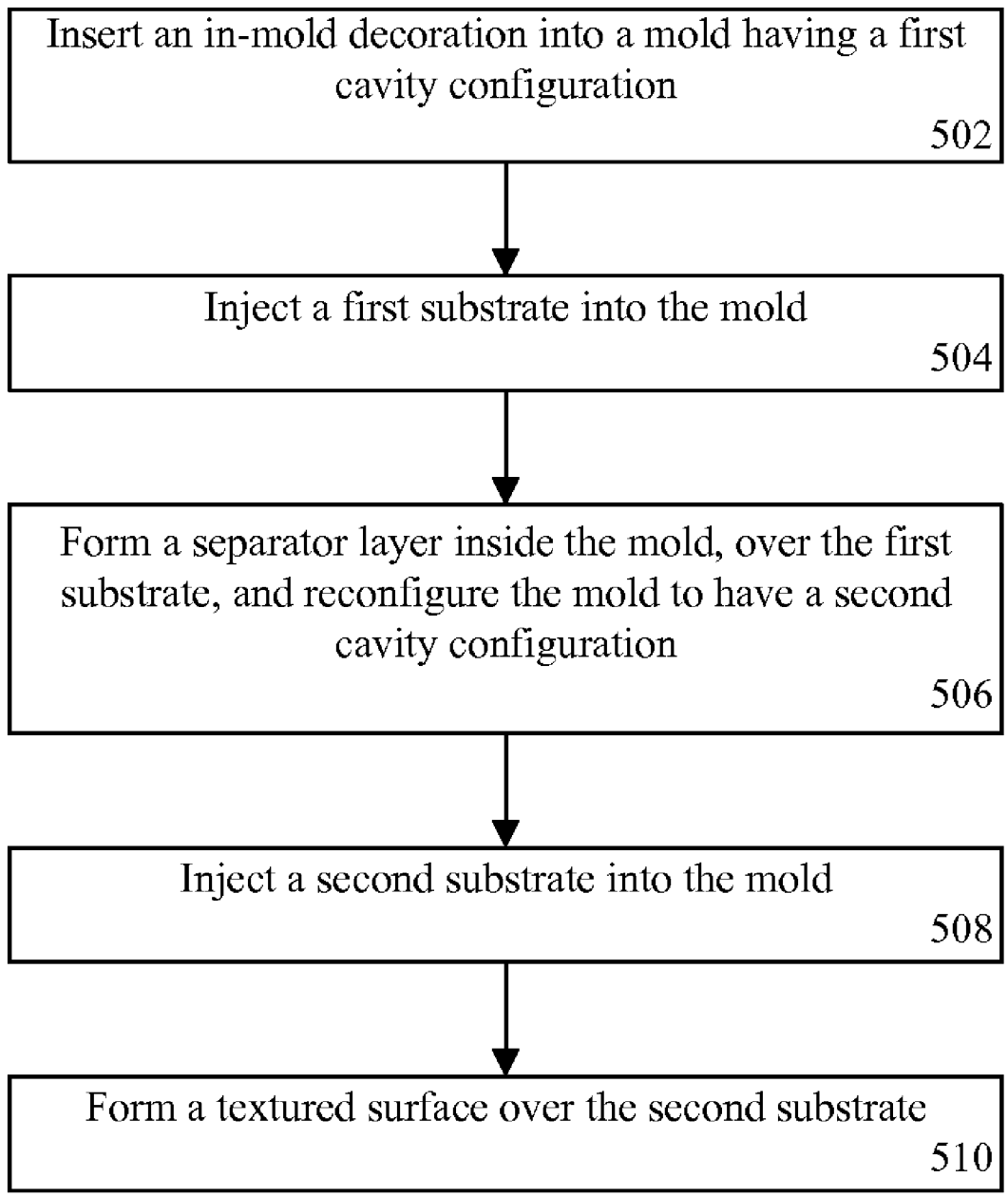
FIG. 5 is a flowchart presenting a method for manufacturing a molded plastic structure, which is useful for understanding the present invention.

While the specification concludes with claims defining features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting but rather to provide an understandable description of the invention.

FIG. 1 depicts a perspective view of a first side 102 of a molded plastic structure (hereinafter "structure") 100 that is useful for understanding the present invention. The structure 100 can be a component of a device which includes one or more illumination features 104, 106, 108, 110. As used herein, the term "illumination feature" means a component or portion of a component which may be illuminated. For example, an illumination feature can be an indicator or a graphic. An illumination feature may be selectively illuminated or permanently illuminated.

In one arrangement, the structure 100 can be a component of a device housing, although the invention is not limited in this regard. Examples of such a device can include, but are not limited to, telephones, radios, computers, personal digital assistants, gaming devices, audio equipment, video equipment, networking equipment, appliances, instruments, and so on. In that regard, although the structure 100 can be substantially planar, this need not be the case. Indeed, the structure 100 can have any desired shape.

The structure 100 can include an in-mold decoration (hereinafter "decoration") 112 that defines the illumination features 104, 106, 108, 110. The decoration 112 can comprise foil (e.g. aluminum), film (e.g. polyester, polypropylene, polyethylene trichloride, polystyrene, etc.) and/or a metalized film. The decoration 112 may further comprise graphic patterns which may be printed or otherwise incorporated onto, the decoration 112 using dyes, inks and/or other colored pigments. The decoration 112 may be integrated into the structure 100 during a molding operation, as will be described in greater detail. For example, the decoration 112 can be proximate to one or more substrates 114, 116 on the first side 102 of the structure 100. As used herein, the term "substrate" means a structural layer comprising a suitable resin, such as plastic. The substrate 114 and the substrate 116 can be substantially contiguous on the first side 102 of the structure 100. The term "proximate," as used herein, is defined as adequately close so as to achieve a desired functionality. For example, the decoration 112 can be adequately close to the second substrate 116 so as to receive light propagating through the second substrate 116 that is intended to be guided to the decoration 112.

Briefly referring to FIG. 2, a perspective view of a second side 218 of the structure 100 is depicted. In one arrangement, the second substrate 116 can be translucent. In another arrangement, the second substrate 116 can be optically clear. The first substrate 114 also may be translucent or optically clear. Alternatively, the first substrate 114 can be opaque. Further, the substrate 114 and the substrate 116 can be substantially contiguous on the second side 218, though this need not be the case.

Reference now should be made to FIG. 3, which depicts an enlarged section view of the molded plastic structure 100 of FIG. 1, taken along section line 3-3. A separation layer 320 can be disposed between at least a portion of the first substrate 114 and at least a portion of the second substrate 116. The separation layer 320 can be configured to backscatter at least a substantial portion of light propagating through the second substrate 116. In an arrangement in which the first substrate 114 is translucent or optically clear, the separation layer 320 also can backscatter a substantial portion of light propagating through the first substrate 114.

As used herein, the term "backscatter" means the reflection, refraction and/or re-radiation of light incident on a first side of an object such that the light is not transmitted through the object so as to radiate from a second opposing side of the object. Thus, a substantial portion of light incident on the separation layer 320 from the second substrate 116 can be reflected and/or re-radiated so as to continue propagating through the second substrate 116. A substantial portion can be greater than 99% of the light, greater than 95% of the light, greater than 90% of the light, greater than 85% of the light, greater than 80% of the light, greater than 75% of the light, greater than 70% of the light, greater than 65% of the light, greater than 60% of the light, greater than 55% of the light, or greater than 50% of the light.

In one arrangement, the separation layer 320 can comprise foil, film or metalized film. In another arrangement, the separation layer 320 can comprise a third substrate, for instance a substrate having a different index of refraction than the second substrate 116 and/or the first substrate 114. In yet another arrangement, the separation layer 320 can be defined by impurities introduced into a portion of the first substrate 114 and/or a portion of the second substrate 116 so as to change a refractive index of the respective portion(s). For example, the separation layer 320 can be defined by air bubbles that are introduced into a portion of the first substrate 114 that is proximate to the second substrate 116, and/or air bubbles that are introduced into a portion of the second substrate 116 that is proximate to the first substrate 114. The separation layer 320 may be introduced into the structure 100 during a molding operation, as also will be described in greater detail.

A back layer 322 also can be provided to backscatter light propagating through the second substrate 116 (and the first substrate 114 if it is translucent or optically clear). The back layer 322 also can comprise foil, film, metalized film, a third substrate, or impurities introduced into the first substrate 114 and/or the second substrate 116. The second substrate 116, the separation layer 320 and, optionally, the back layer 322 can define one or more of light pipes 324, 326, 328 through which light can be transmitted to illumination features. Similarly, in an arrangement in which the first substrate 114 is translucent, the first substrate 114, the separation layer 320 and the decoration 112 can define one or more of light pipes 330, 332 through which light can be transmitted to illumination features.

A textured surface 334 can be provided on the back layer 322 in a region proximate, and in opposition, to illumination features, such as the illumination feature 108. For example, the textured surface 334 can be disposed on, or positioned proximate to, a side 323 of the back layer 322, directly opposing the illumination feature 108. In another arrangement, the textured surface 334 can be defined in the second substrate 116, for instance on a side 325 of the second substrate 116 opposing the illumination features.

The textured surface 334 can be configured to cause a substantial portion of light propagating through the second substrate 116 to reflect and/or refract toward the illumination features. For example, the textured surface 334 can reflect and/or refract light such that a portion of the light is orthogonally incident on a portion 336 of the separation layer 320 that is proximate to the illumination feature 108. Orthogonally incident light may exhibit less reflection/refraction as compared to light incident at other angles. Accordingly, much of the light orthogonally incident at the portion 336 will pass through the separation layer 320 to illuminate the illumination feature 108. Further, the portion 336 of the separation layer 320 also can be locally transparent, for example if other portions of the separation layer 320 are reflective or otherwise opaque, though this need not be the case. In one arrangement, the textured surface 334 can comprise a micro-lens array. Micro-lens arrays are known to the skilled artisan.

FIG. 4, which also is a section view taken along section line 3-3, depicts another arrangement of the molded plastic structure 100. In this arrangement, the first substrate 114 can be translucent or optically clear and a thin layer 438 of the first substrate 114 can extend beneath the decoration 112. Such an arrangement can be used to provide mechanical stiffness to the first substrate 114 as it remains in a mold during various molding processes. Further, a thin layer 440 of the second substrate 116 can extend between the separation layer 320 and the back layer 322. This arrangement can be used to reduce any tendency for the separation layer 320 to pull away from the substrate 114 during the molding process. The decision whether to implement the layer 438 and/or the layer 440 can be dependent on the type of resins used to form the structure 100 and the geometry of the structure 100.

Referring again to FIG. 1, the second substrate 116, which defines the light pipe 324, can be positioned at a first portion 142 of the structure 100, proximate to the illumination feature 108. The second substrate 116 can extend to a second portion 144 of the structure 100, which can be positioned distally from the illumination feature 108. For example, the second portion 144 can be positioned proximate to a light source 146 (e.g. a lamp, LED, etc.). Thus, the light pipe 324 can convey light from the light source 146 to the illumination feature 108. As used herein, the term "distal" means not close. For example, the second portion 144 can be positioned distant from the illumination feature 108 such that the light pipe 324 is necessary to insure adequate light is conveyed from the portion 144 to the illumination feature 108.

As noted, the first substrate 114 also can define one or more light pipes. For example, the first substrate 114, which can define a light pipe 148, can be positioned at a third portion 150 of the structure 100, proximate to the illumination feature 110. The first substrate 114 can extend to a fourth portion 152 of the structure 100, which can be positioned distally from the illumination feature 110. For example, the fourth portion 152 can be positioned proximate to a light source 154. Thus, the light pipe 148 can convey light from the light source 154 to the illumination feature 110. Still, other light pipes, for example light pipes 326, 328, can be defined in the structure 100 and the invention is not limited in this regard.

FIG. 5 is a flowchart presenting a method 500 of manufacturing a molded plastic structure, which is useful for understanding the present invention. At step 502, an in-mold decoration comprising one or more illumination features can be inserted into a mold having a first cavity configuration. For example, the decoration 112 can be clamped into place between a first component and a second component of an injection mold. At step 504 a first substrate, for example a plastic resin, can be injected into the mold. The first and second components of the mold can be separated after the first substrate has suitably cured.

At step 506, a separation layer can be formed over the first substrate. For instance, the first and second portions of the mold can be separated to expose the first substrate, and the first substrate can be retained in the first portion of the mold. A foil, film or a metalized film which may define the separation layer can be placed over the first substrate. In another arrangement, a third substrate can be introduced over the first substrate. As noted, the third substrate can have a different index of refraction than the first substrate or a second substrate that may be introduced into the mold. In yet another arrangement, impurities, such as gas bubbles, can be introduced to define the separation layer. For example, the separation layer can comprise a film that is impregnated with air bubbles. In another arrangement, the separation layer can comprise one or more materials that generate gas bubbles during the molding process, for instance when exposed to high temperatures associated with the molding process. The impurities also can be introduced on a portion of the first substrate that will interface with a portion of the second substrate, and/or on a portion of the second substrate that will interface with a portion of the first substrate.

A third component of the mold can be mated to the first component, replacing the second component and reconfiguring the mold to have a second cavity configuration. In an arrangement in which the separation layer comprises a foil, film or metalized film, the separation layer can be clamped between the first and third components of the mold.

Proceeding to step 508, a second translucent or optically clear substrate can be injected into the additional cavity space defined by the third portion of the mold, thereby defining at least one light pipe in the molded plastic structure. The light pipe can extend from a first portion of the molded plastic structure proximate to the first illumination feature to a second portion of the molded plastic structure distal from the illumination feature. The first and third portions of the mold can be separated after the second substrate has suitably cured or cooled.

At step 510, a textured surface can be formed over the second substrate. For example, a back layer which comprises one or more textured surfaces can be applied over the structure that comprises the first and second substrates. The textured surface(s) can be positioned proximate to the illumination features. In lieu of a textured back layer, one or more textured surfaces can be introduced on the second substrate by defining such textured surfaces in the mold, for instance in the first portion and/or the third portion of the mold. Textured surfaces also may be defined in the first and/or second portions of the mold to introduce textured surfaces on the first substrate, but the invention is not limited in this regard.

The flowchart and diagrams in the figures illustrate the architecture, functionality, and operation of possible implementations of systems and methods according to various embodiments of the present invention. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e. open language).

This invention can be embodied in other forms without departing from the spirit or essential attributes thereof. Accordingly, reference should be made to the following claims, rather than to the foregoing specification, as indicating the scope of the invention.

What is claimed is:

1. A molded plastic structure, comprising:
   an in-mold decoration comprising at least a first illumination feature positioned at a first portion of the molded plastic structure;
   a first substrate positioned proximate to the in-mold decoration;
   a substantially optically clear or translucent second substrate positioned proximate to the in-mold decoration, the second substrate extending from the first portion of the molded plastic structure to a second portion of the molded plastic structure, the second portion distal from the first portion; and
   a separation layer positioned between at least a portion of the first substrate and at least a portion of the second substrate, the separation layer backscattering a substantial portion of light incident on at least a first side of the separation layer.

2. The molded plastic structure of claim 1, wherein the separation layer comprises at least one material selected from the group consisting of a foil, a film and a metalized film.

3. The molded plastic structure of claim 1, wherein the separation layer comprises a third substrate.

4. The molded plastic structure of claim 1, wherein the separation layer is defined by impurities that are introduced into a portion of the first substrate, a portion of the second substrate, or a portion of a third substrate.

5. The molded plastic structure of claim 1, wherein the second portion of the molded plastic structure is positioned proximate to a light source.

6. The molded plastic structure of claim 1, wherein the first substrate and the second substrate define a substantially continuous surface.

7. The molded plastic structure of claim 1, further comprising a textured surface positioned in a region proximate to the first illumination feature.

8. The molded plastic structure of claim 7, wherein the textured surface comprises a micro-lens array.

9. The molded plastic structure of claim 1, wherein:

the in-mold decoration comprises a second illumination feature positioned at a third portion of the molded plastic structure;

the first substrate is optically clear or translucent; and the first substrate extends from the third portion of the molded plastic structure to a fourth portion of the molded plastic structure, the fourth portion distal from the third portion.

10. The molded plastic structure of claim 9, wherein the fourth portion of the molded plastic structure is positioned proximate to a light source.

11. A device housing, comprising:

an in-mold decoration comprising at least a first illumination feature positioned at a first portion of the device housing;

a first substrate positioned proximate to the in-mold decoration;

a substantially optically clear or translucent second substrate positioned proximate to the in-mold decoration, the second substrate extending from the first portion of the device housing to a second portion of the device housing, the second portion distal from the first portion; and a separation layer positioned between at least a portion of the first substrate and at least a portion of the second substrate, the separation layer backscattering a substantial portion of light incident on at least a first side of the separation layer.

12. The device housing of claim 11, wherein the separation layer comprises at least one material selected from the group consisting of a foil, a film and a metalized film.

13. The device housing of claim 11, wherein the separation layer comprises a third substrate.

14. The device housing of claim 11, wherein the separation layer is defined by impurities that are introduced into a portion of the first substrate, a portion of the second substrate, or a portion of a third substrate.

15. A method of manufacturing a molded plastic structure, comprising:

inserting an in-mold decoration comprising at least a first illumination feature into a mold having a first cavity configuration;

injecting a first substrate into the mold;

forming a separation layer over the first substrate; and injecting a second translucent or optically clear substrate into the mold to define at least one light pipe extending from a first portion of the molded plastic structure proximate to the first illumination feature to a second portion of the molded plastic structure distal from the illumination feature.

16. The method of claim 15, wherein forming the separation layer comprises placing a foil, film or metalized film over the first substrate.

17. The method of claim 15, wherein forming the separation layer comprises a third substrate over the first substrate.

18. The method of claim 15, wherein forming the separation layer comprises introducing impurities into a portion of the first substrate or a portion of the second substrate.

19. The method of claim 15, wherein forming the separation layer comprises introducing air bubbles into a portion of the first substrate, a portion of the second substrate, or a portion of a third substrate that forms the separation layer.

20. The method of claim 15, wherein injecting the second substrate comprises introducing a textured surface on the second substrate.

21. A method of manufacturing a molded plastic structure, comprising:

inserting an in-mold decoration comprising at least a first illumination feature into a mold having a first cavity configuration;

injecting a first translucent or optically clear substrate into the mold to define at least one light pipe extending from a first portion of the molded plastic structure proximate to the first illumination feature to a second portion of the molded plastic structure distal from the illumination feature;

forming a separation layer over the first substrate; and injecting a second substrate into the mold.

* * * * *